(12) United States Patent
Adusumilli et al.

(10) Patent No.: US 11,488,980 B2
(45) Date of Patent: Nov. 1, 2022

(54) WAFER WITH LOCALIZED SEMICONDUCTOR ON INSULATOR REGIONS WITH CAVITY STRUCTURES

(71) Applicant: GLOBALFOUNDRIES U.S. INC., Santa Clara, CA (US)

(72) Inventors: Siva P. Adusumilli, South Burlington, VT (US); Anthony K. Stamper, Burlington, VT (US); Bruce W. Porth, Jericho, VT (US); John J. Ellis-Monaghan, Grand Isle, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 54 days.

(21) Appl. No.: 17/003,179

(22) Filed: Aug. 26, 2020

(65) Prior Publication Data

US 2022/0068975 A1 Mar. 3, 2022

(51) Int. Cl.
*H01L 27/12* (2006.01)
*H01L 21/762* (2006.01)
*H01L 29/06* (2006.01)

(52) U.S. Cl.
CPC .... *H01L 27/1207* (2013.01); *H01L 21/76289* (2013.01); *H01L 29/0649* (2013.01)

(58) Field of Classification Search
CPC .......... H01L 27/1207; H01L 21/76289; H01L 29/0649
See application file for complete search history.

(56) References Cited

U.S. PATENT DOCUMENTS

| | | | |
|---|---|---|---|
| 4,786,608 A | 11/1988 | Griffith | |
| 5,723,896 A | 3/1998 | Yee et al. | |
| 6,833,322 B2 | 12/2004 | Anderson et al. | |
| 7,015,147 B2 | 3/2006 | Lee et al. | |
| 7,038,289 B2 | 5/2006 | Marty et al. | |
| 7,078,298 B2 | 7/2006 | Lee et al. | |
| 7,511,317 B2 | 3/2009 | Adam et al. | |
| 7,642,167 B2 | 1/2010 | Kwon | |
| 8,299,537 B2 | 10/2012 | Greco et al. | |
| 8,324,031 B2 | 12/2012 | Tan et al. | |
| 8,455,308 B2 | 6/2013 | Cheng | |
| 8,610,211 B2 | 12/2013 | Furukawa et al. | |
| 8,674,472 B2 | 3/2014 | Botula et al. | |
| 8,722,508 B2 | 5/2014 | Botula et al. | |
| 8,772,902 B2 | 7/2014 | Assefa et al. | |
| 9,633,894 B2 | 4/2017 | Jaffe et al. | |
| 10,164,101 B1 | 12/2018 | Camillo-Castillo et al. | |
| 10,192,779 B1 | 1/2019 | Shank et al. | |

(Continued)

OTHER PUBLICATIONS

Office Action in U.S. Appl. No. 17/028,178 dated Nov. 15, 2021, 10 pages.

(Continued)

*Primary Examiner* — Julia Slutsker
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to a wafer with localized cavity structures and methods of manufacture. A structure includes a bulk substrate with localized semiconductor on insulator (SOI) regions and bulk device regions, the localized SOI regions includes multiple cavity structures and substrate material of the bulk substrate.

19 Claims, 8 Drawing Sheets

(56) References Cited

U.S. PATENT DOCUMENTS

| | | |
|---|---|---|
| 10,211,087 B2 | 2/2019 | Jaffe et al. |
| 10,388,728 B1 | 8/2019 | Zierak et al. |
| 10,446,643 B2 | 10/2019 | Adusumilli et al. |
| 10,461,152 B2 | 10/2019 | Stamper et al. |
| 2012/0292700 A1 | 11/2012 | Khakifirooz |
| 2014/0353725 A1* | 12/2014 | Adkisson ............ H01L 29/7371 |
| | | 438/318 |
| 2015/0348825 A1* | 12/2015 | Hebert .................. H01L 21/764 |
| | | 438/421 |
| 2016/0093523 A1 | 3/2016 | Jaffe |
| 2018/0166536 A1* | 6/2018 | Shank .................. H01L 21/762 |
| 2020/0144369 A1 | 5/2020 | Lin |
| 2021/0239647 A1 | 8/2021 | Chang |

OTHER PUBLICATIONS

Specification and Drawings in U.S. Appl. No. 16/806,383, filed Mar. 2, 2020, 20 pages.

Convey et al., "30 years of microfluidics", Micro and Nano Engineering, 2019, vol. 2, 16 pages.

Final Office Action in U.S. Appl. No. 17/028,178 dated May 20, 2022, 8 pages.

Response to Final Office Action in U.S. Appl. No. 17/028,178, filed Jun. 30, 2022, 7 pages.

* cited by examiner

WAFER WITH LOCALIZED SEMICONDUCTOR ON INSULATOR REGIONS WITH CAVITY STRUCTURES

FIELD OF THE INVENTION

The present disclosure relates to semiconductor structures and, more particularly, to a wafer with localized cavity structures and methods of manufacture.

BACKGROUND

Device structures, such as radiofrequency switches, are susceptible to high capacitance and body-to-body leakage when formed using a bulk semiconductor wafer. To alleviate these issues, silicon-on-insulator wafers can be used to replace the bulk wafer. The silicon-on-insulator wafers include a buried insulator layer arranged between the body furnishing an active device region of the device structure and the body of the substrate beneath the buried insulator layer. Another measure to reduce the susceptibility of high capacitance and body-to-body leakage is to provide triple well isolation that surrounds the active device region of the device structure.

SUMMARY

In an aspect of the disclosure, a structure comprises a bulk substrate with localized semiconductor on insulator (SOI) regions and bulk device regions, the localized SOI regions comprising multiple cavity structures and substrate material of the bulk substrate.

In an aspect of the disclosure, a structure comprises: at least one bulk device region comprising bulk substrate material; and a plurality of localized semiconductor on insulator (SOI) device regions coplanar with the at least one bulk device region, the localized SOI device regions comprising multiple cavity structures having different depths within the bulk substrate material and an upper layer of the bulk substrate material.

In an aspect of the disclosure, a method comprises: forming amorphous regions of a first depth within a bulk substrate; forming amorphous regions of a second depth within the bulk substrate; removing the amorphous regions to form cavity structures at the first depth and the second depth, leaving substrate material of the bulk substrate above the cavity structures; and lining the cavity structures with insulator material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a wafer with localized cavity structures and methods of manufacture. More specifically, the present disclosure is directed to localized semiconductor-on-insulator (SOI) regions with cavity structures formed from bulk wafers, e.g., Si wafers. Advantageously, the present disclosure provides bulk devices and SOI devices on a same wafer, with localized SOI regions with cavity structures of different depths for variable design criteria.

In embodiments, localized SOI regions with cavity structures are embedded within a bulk wafer, e.g., Si. The localized SOI regions with cavity structures will have variable substrate thicknesses (e.g., Tsi1, Tsi2, etc.). The thickness of the substrate in the localized SOI regions can be varied by an implant energy (e.g., Argon implant energy). In embodiments, the buried oxide region of the localized SOI regions can include the cavity structures, with the buried oxide also having variable thicknesses. The cavity structures can also include partially oxidized pillars for heat dissipation or body biasing.

The wafer also includes bulk regions comprising a recrystallized region and/or a buried polycrystalline region on the same wafer with the localized SOI regions. In this way, the bulk wafer, e.g., bulk regions, can have a buried trap rich/damage layer. The localized SOI regions and the bulk regions will be coplanar for device fabrication. For example, in embodiments, the bulk region can include passive devices, e.g., over the buried polycrystalline material; whereas, other regions of the wafer including the localized SOI regions with cavity structures can include active devices.

The localized SOI regions with cavity structures can be formed by an implantation process as described in more detail herein. For example, implantation of heavy species through a thin oxide layer can be used to form amorphous regions. This leaves a thin c-Si layer above the amorphous region. After removing non-crystalline Si regions through Si defect etches or similar etches during shallow trench isolation (STI) processes, deep trench (DT) processes, etc., crystalline Si will become the upper semiconductor layer for the localized SOI regions.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
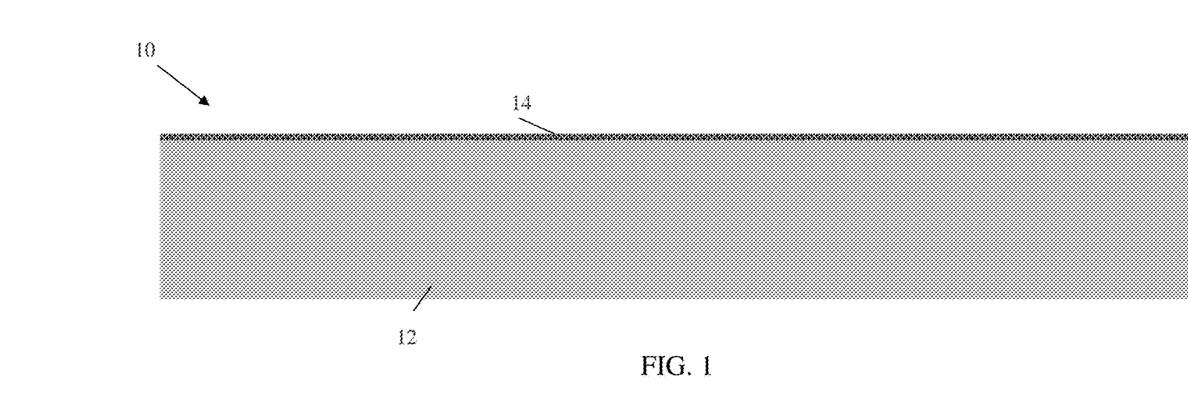
FIG. 1 shows a substrate, amongst other features, and respective fabrication processes according to aspects of the present disclosure.

FIG. 1 shows a substrate, amongst other features, and respective fabrication processes according to aspects of the present disclosure. More specifically, the structure 10 of FIG. 1 shows a substrate 12. The substrate 12 is a bulk wafer preferably composed of Si material. In embodiments, though, the substrate 12 can be composed of any suitable bulk substrate material, e.g., Si, SiGe, SiGeC, SiC, GaAs, InAs, InP, and other III/V or II/VI compound semiconductors. In preferred embodiments, the substrate 12 comprises any suitable crystallographic orientation (e.g., a (100), (110), (111), or (001) crystallographic orientation).

Still referring to FIG. 1, a pad material (e.g., oxide) 14 is deposited on the substrate 12. The pad oxide 14 can be deposited on the substrate 12 using any suitable deposition process. For example, the pad oxide 14 can be deposited on the substrate 12 using a chemical vapor deposition (CVD) process as is known to those of skill in the art such that no further explanation is required.

Figure 2:
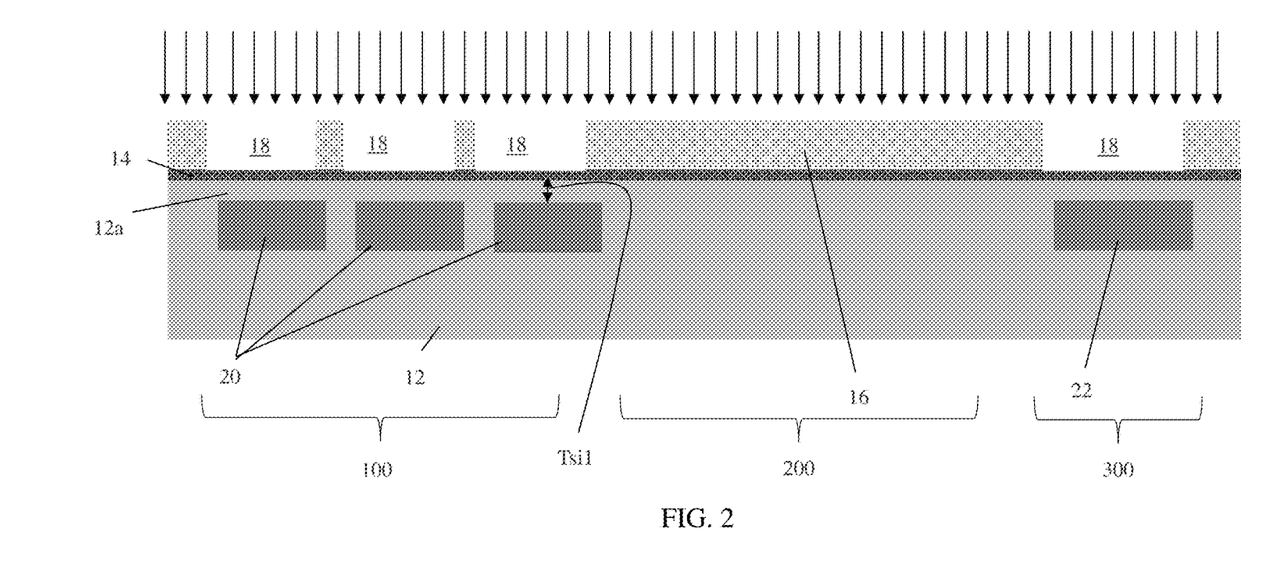
FIG. 2 shows amorphous regions in the substrate, amongst other features, and respective fabrication processes according to aspects of the present disclosure.

FIG. 2 shows amorphous regions 20, 22 in the substrate 12 and respective fabrication processes. As described in more detail below, the amorphous regions 20, 22 are formed at different device regions 100, 300 at a certain depth Tsi1 within the substrate 12 by an implantation process at a certain energy level. This implantation process results in the bulk material of the substrate 12 being above and below the amorphous regions 20, 22 in the different device regions 100, 300, effectively beginning the formation of the localized semiconductor on insulator (SOI) regions.

More specifically, in FIG. 2, a mask 16 is deposited over the pad oxide material 14. The mask 16 is any known implantation mask that may include a layer of a light-sensitive material, such as an organic photoresist, applied by a spin coating process, pre-baked, exposed to light projected through a photomask, baked after exposure, and developed with a chemical developer. As should be understood by those of skill in the art, the implantation mask 16 has a thickness and stopping power sufficient to block masked areas against receiving a dose of the implanted ions.

The mask 16 is patterned to form openings 18 in device regions 100, 300. The patterning of the mask 16 can be formed by conventional lithography and etching methods known to those of skill in the art. For example, a resist formed over the mask 16 is exposed to energy (light) to form a pattern (opening). An etching process with a selective chemistry, e.g., reactive ion etching (RIE), will be used to form one or more openings (patterns) 18 in the mask 16 through the openings of the resist. The resist can then be removed by a conventional oxygen ashing process or other known stripants. Following the resist removal, an implant process is performed through the openings 18 to form amorphous regions 20, 22 in different device regions 100, 300.

Still referring to FIG. 2, following the patterning, an ion implantation process is performed through the openings 18 to form the amorphous regions 20, 22. In embodiments, the ion implantation process comprises an argon implantation process to form the amorphous regions 20, 22 in the different device regions 100, 300. Depending on the energy level, the amorphous regions 20, 22 can be at different depths, e.g., the substrate 12 above the amorphous regions 20, 22 can be of different thicknesses Tsi1. For example, the energy level of the argon implantation can be about 400 Key resulting in a thickness of about 50 nm. It should be understood by those of skill in the art that other energy levels and resultant thicknesses Tsi1 are contemplated herein, depending on the desired design performances of the resultant devices formed in the different device regions 100, 200, 300.

Figure 3:
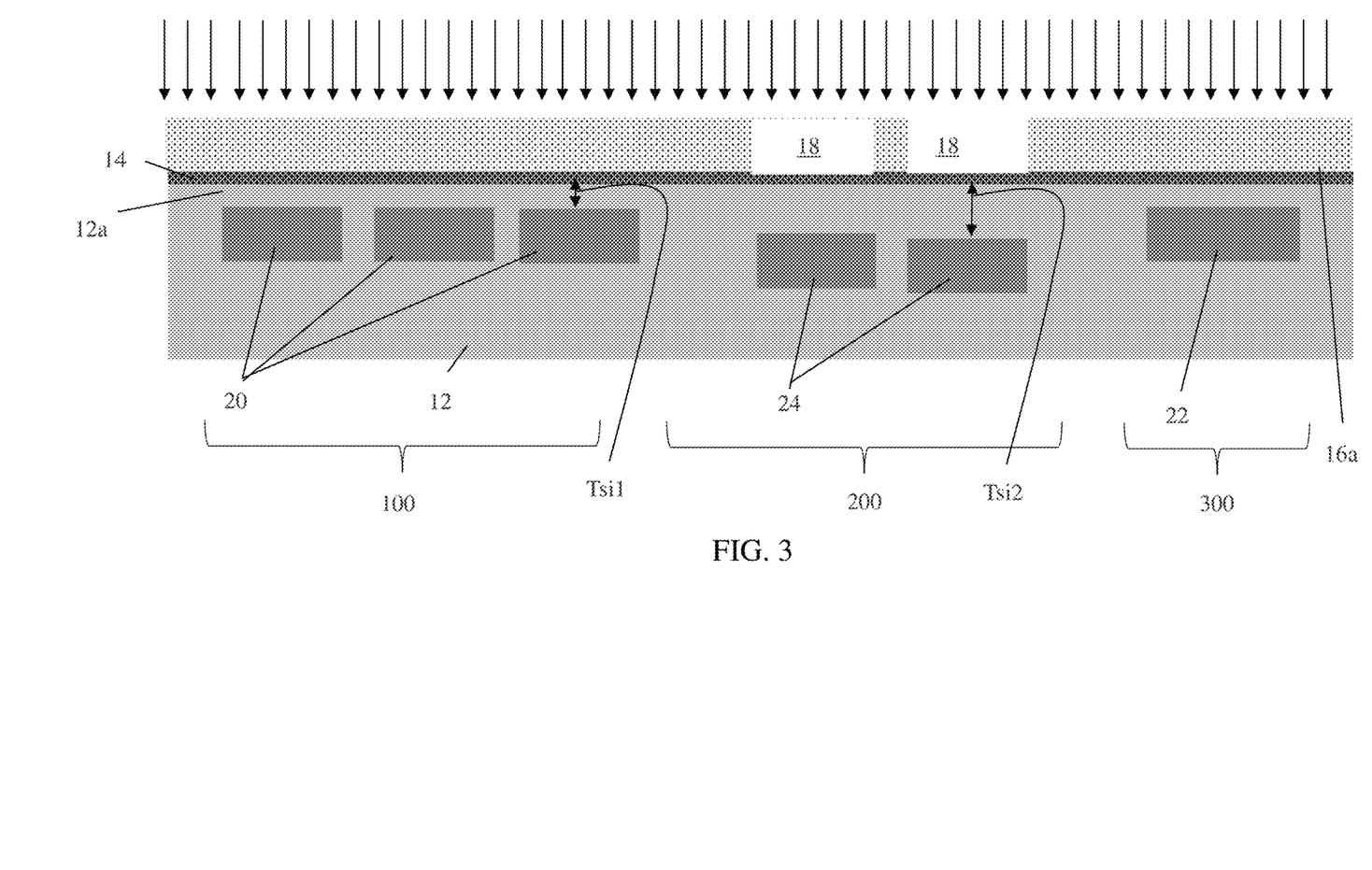
FIG. 3 shows additional amorphous regions in the substrate, amongst other features, and respective fabrication processes according to aspects of the present disclosure.

FIG. 3 shows amorphous regions 24 in the substrate 12 at device region 200, which are formed by another implantation process. In this implantation process, the amorphous regions 24 in the substrate 12 at device region 200 will be formed at a different depth, e.g., the substrate 12 above the amorphous regions 24 in the device region 200 can be of thicknesses Tsi2. In this embodiment, Tsi2>Tsi1. For example, with a different implantation energy, e.g., 300 Key, a resultant thickness of Tsi2, e.g., 100 nm, can be achieved. This implantation process will effectively begin the formation of the localized semiconductor on insulator (SOI) region in device region 200, with different dimensions than will be achieved in device region 100.

More specifically, in FIG. 3, following the stripping of the previous mask, a new implantation mask 16a is deposited over the pad oxide material 14. The mask 16a is patterned to form openings 18 in device region 200, using conventional lithography and etching methods known to those of skill in the art and as already described herein. Following the patterning, an argon ion implantation process is performed through the openings 18 to form the amorphous regions 24 in the device regions 200 at a depth of Tsi2. It should also be understood that by modulating the energy level of the implantation process, it is also possible to modulate the dimensions of the amorphous regions 24, e.g., making the amorphous regions 24 larger or smaller than the amorphous regions 20, 22.

Figure 4:
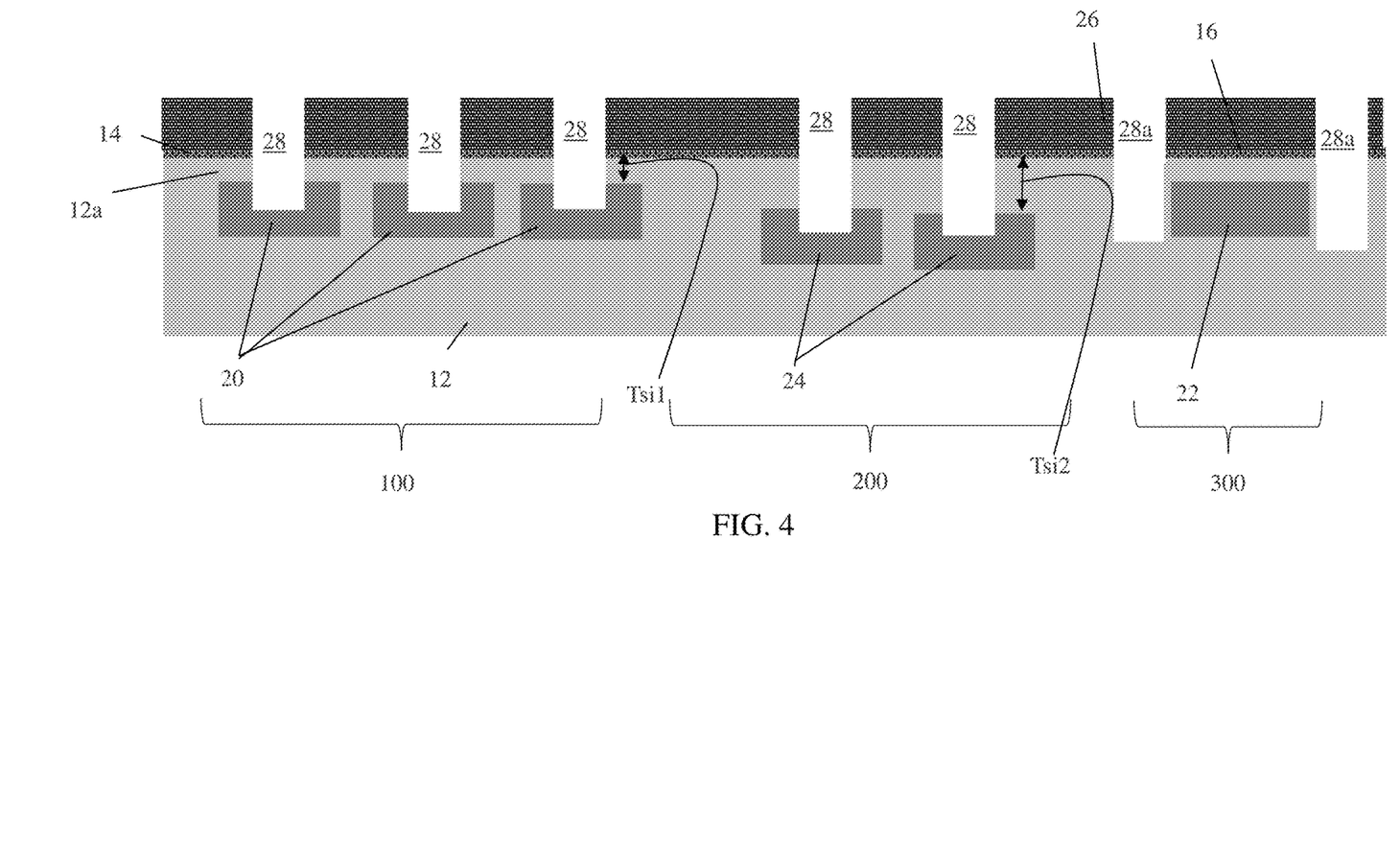
FIG. 4 shows trenches in different device regions, amongst other features, and respective fabrication processes according to aspects of the present disclosure.

In FIG. 4, following the stripping of the mask 16, a pad material 26 will be deposited over the pad material 14. In embodiments, the pad material 26 can be a pad nitride material that is deposited by conventional deposition methods, e.g., CVD. Following the deposition of the pad material 26, the structure undergoes trench formation 28a, 28b using conventional lithography and etching processes, as already described herein. In embodiments, the trenches 28 are provided in the device regions 100, 200 and extend into or, at least expose a top surface, of the amorphous regions 20, 24. On the other hand, the trenches 28a are provided in the device region 300 and extend on sides of the amorphous regions 22. In embodiments, a sliver of c-Si, e.g., crystallized substrate 12, remains on the sidewalls of trenches 28a. The sliver of c-Si, e.g., crystallized substrate 12, will be fully oxidized during the liner oxidation step as disclosed with respect to FIG. 5. The trenches 28a can be used as deep trench isolation features as described herein.

Figure 5:
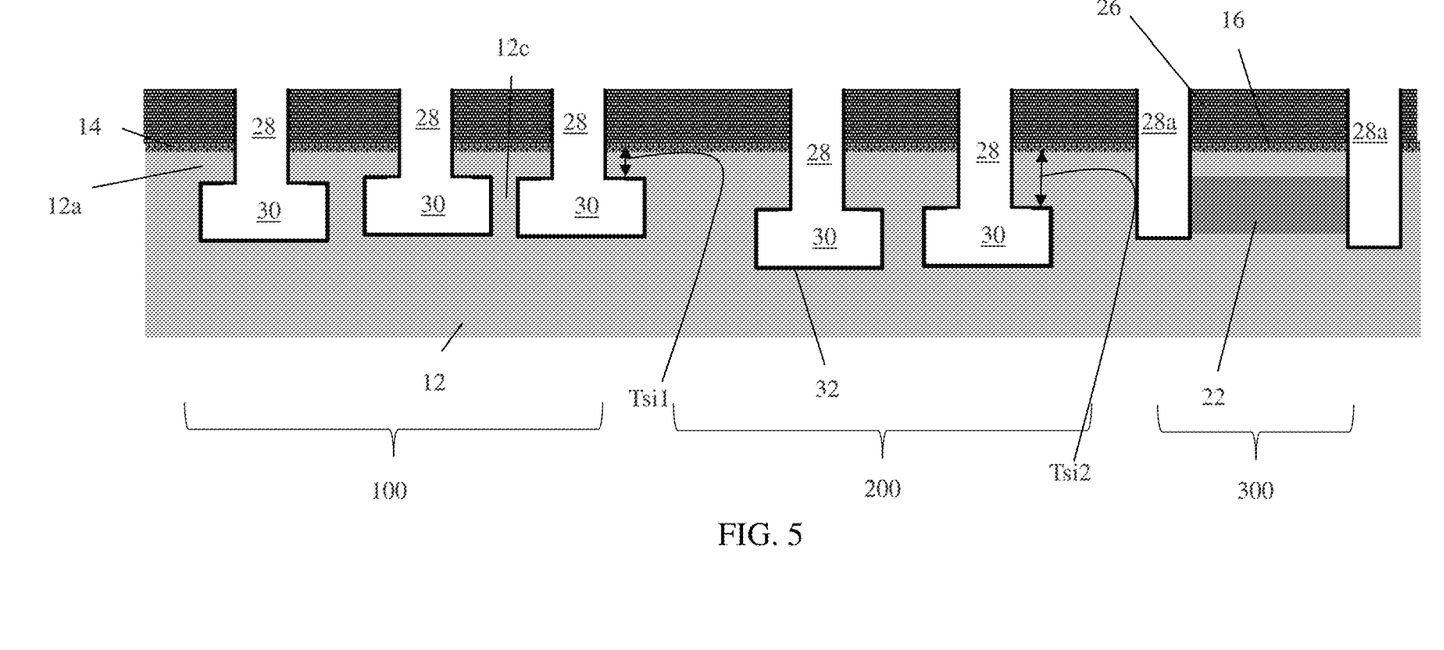
FIG. 5 shows cavity structures in different device regions, amongst other features, and respective fabrication processes according to aspects of the present disclosure.

FIG. 5 shows the formation of cavity structures 30, amongst other features, and respective fabrication processes. In embodiments, the cavity structures 30 extend from the trenches 28 and are formed by removing the amorphous regions 20, 24. The cavity structures 30 can be formed by a selective etching process, e.g., defect etch process. For example, the cavity structures 30 are formed by the removal of the material of the amorphous regions 20, 24 using an etching chemistry that is selective to the amorphous material (e.g., defective material) in the amorphous regions 20, 24. This etching process can be, e.g., a secco etching process; although other defect or amorphous material etching processes are contemplated herein.

The trenches 28, 28 and cavity structures 30 are lined with oxide, using a conventional oxidation process. The oxidation process will result in partial or fully oxidized semiconductor (Si) pillars 12c between the cavity structures 30. The pillars 12c can have different thickness, corresponding to the patterns of the different masks. Also, the pillars 12c can be partially or fully oxidized based on their respective thicknesses, which can be modulated by the implantation process. The partially or fully oxidized pillars 12c can provide for heat dissipation or body biasing.

Figure 6:
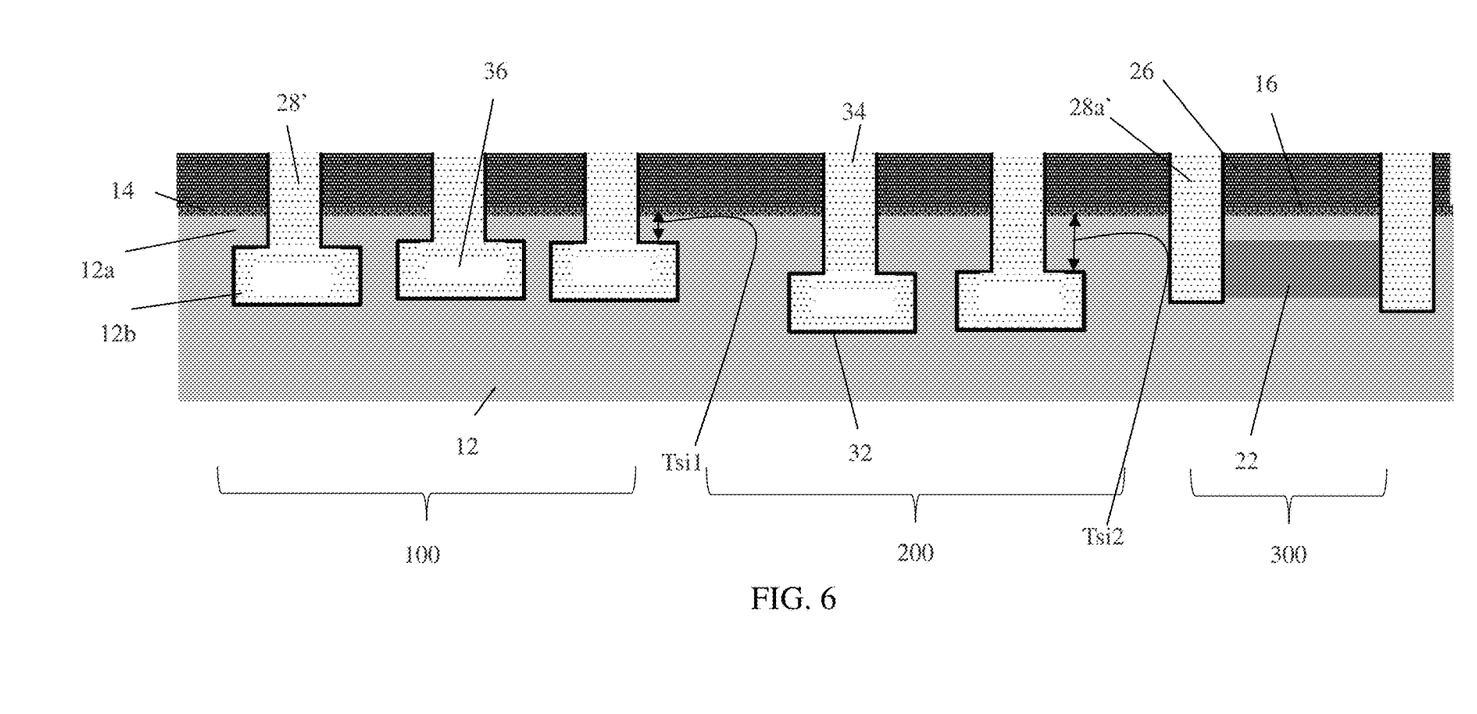
FIG. 6 shows localized semiconductor on insulator (SOI) regions with the cavity structures filled with an insulator material, amongst other features, and respective fabrication processes according to aspects of the present disclosure.

FIG. 6 shows an insulator (e.g., oxide) fill process of the cavity structures 30 and trenches 28, 28a. The oxide fill process will partially fill the cavity structures 30 with oxide (or other insulator material) 34, while also forming shallow trench isolation structures 28' and deep trench isolation structures 28a'. In embodiments, the cavity structures 30 will not be completely filled with the insulator material, e.g., oxide, due to a pinch-off phenomena during the deposition process. Accordingly, the cavity structures 30 will include an airgap 36, providing additional insulative properties. A planarization process such as a chemical mechanical polishing (CMP) process can be performed to remove any excessive insulator material on the surface of the structure.

In embodiments, localized SOI regions are formed in the device regions 100, 200 by the combination of the cavity structures 30 (partially filled with the insulator material) with semiconductor material 12a above the cavity structures 30 and the substrate material 12 of the bulk wafer below the cavity structures 30. As should be understood by those of skill in the art, the cavity structures 30 partially filled with the insulator material will form the buried oxide (BOX) 12b of the localized SOI regions.

Also, as seen in FIG. 6, for example, the localized SOI regions will have different thicknesses of the upper semiconductor material 12a, e.g., Tsi1 and Tsi2. As already described herein, the variable substrate thicknesses (e.g., Tsi1, Tsi2, etc.) is the result of the varied implant energy (e.g., Argon implant energy). Moreover, in embodiments, the BOX region 12b (e.g., partially filled cavity structures 30) can also have variable thicknesses, depending on the implantation processes, e.g., the depth of the implant which was used to form the amorphous regions 24.

Figure 7:
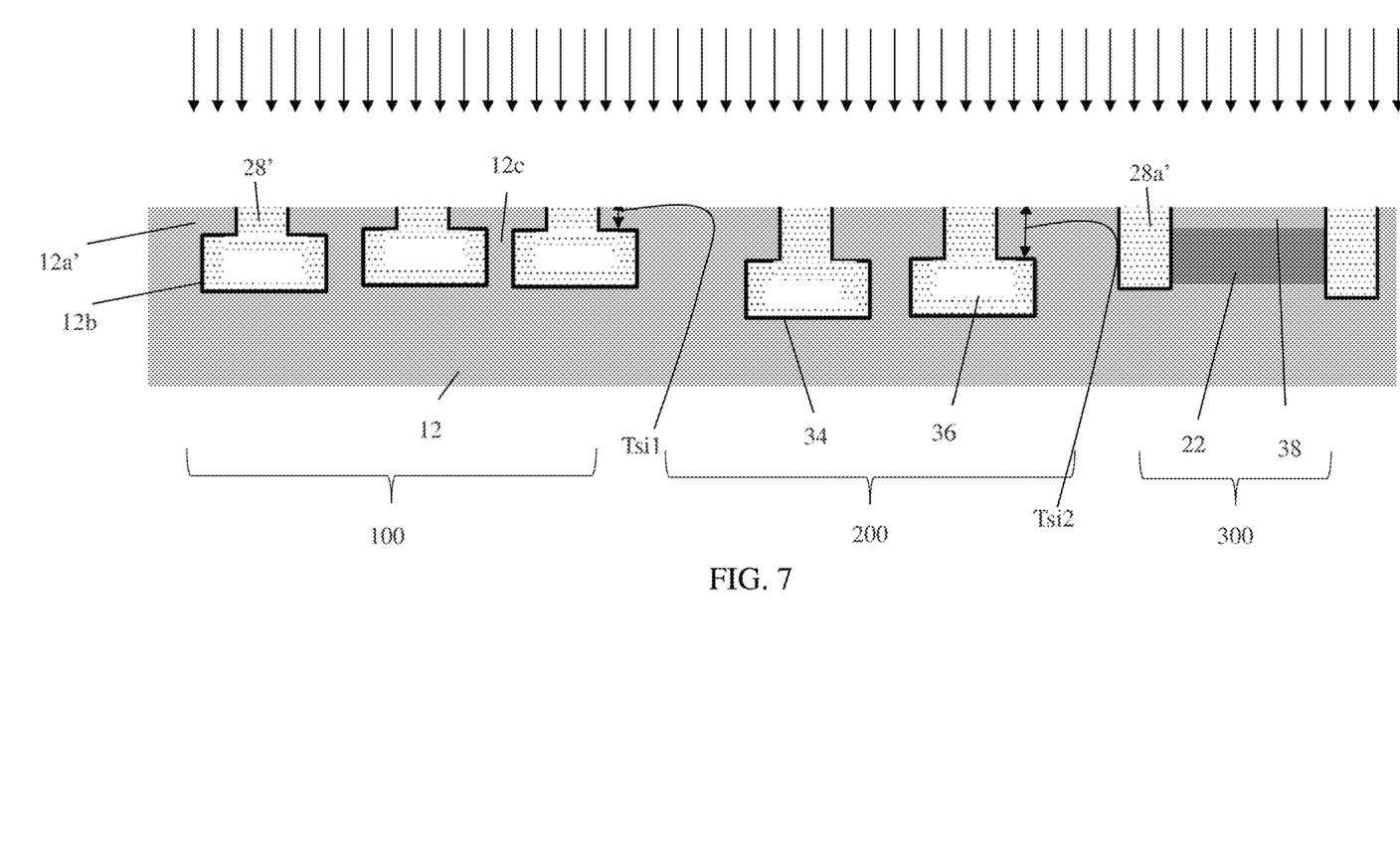
FIG. 7 shows recrystallized semiconductor material of the localized SOI regions, amongst other features, and respective fabrication processes according to aspects of the present disclosure.

FIG. 7 shows recrystallized semiconductor material of the localized SOI regions, amongst other features, and respective fabrication processes. More specifically, as shown in FIG. 7, the pad materials 16, 26 are removed by an etching process, followed by a rapid thermal anneal process. In embodiments, the etching process can be a hot phosphorous chemistry which is used to remove the pad materials 16, 26. The removal of the pad materials will result in a coplanar surface for each of the device regions 100, 200, 300.

A rapid thermal anneal process will recrystallize the upper semiconductor material 12a' of the localized SOI regions in device regions 100, 200. In addition, the rapid thermal anneal process will recrystallize the amorphous material 22 in device region 300, forming crystallized semiconductor material 38 between the deep trench isolation features 28a' in the bulk region (e.g., device region 300). In embodiments, the rapid thermal anneal process will heat the substrate material to high temperatures up to 1200° C. or greater on a timescale of several seconds or less.

Figure 8:
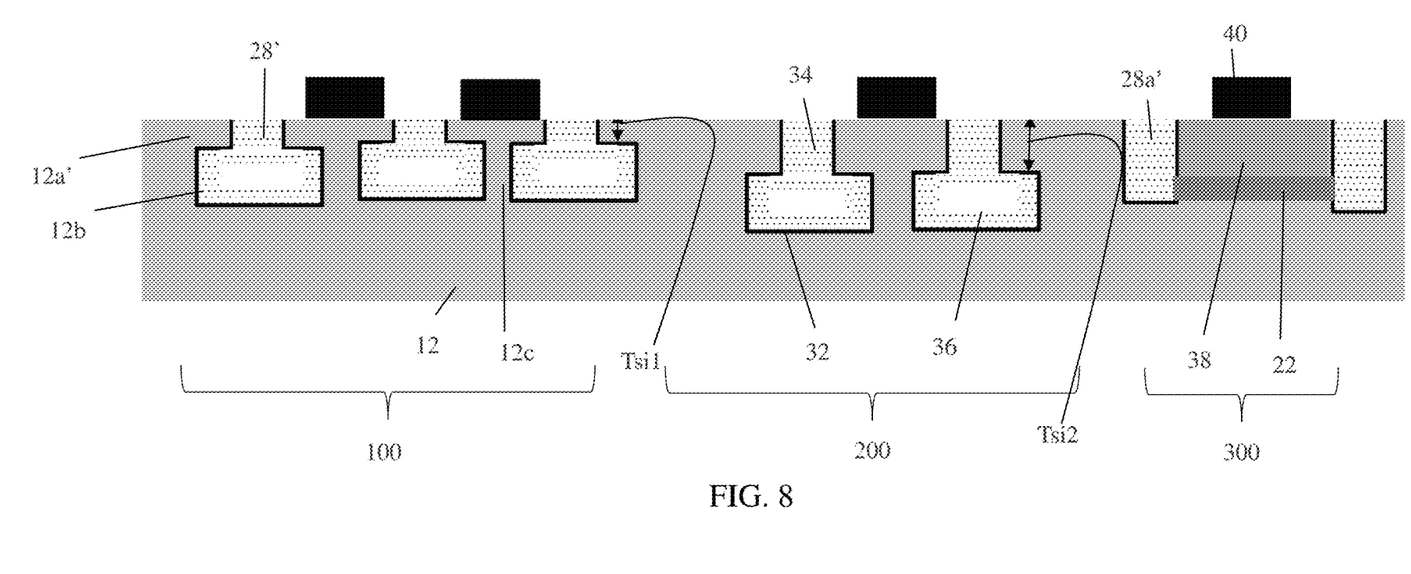
FIG. 8 shows devices on the recrystallized semiconductor material of the localized SOI regions and bulk regions, amongst other features, and respective fabrication processes according to aspects of the present disclosure.

In FIG. 8, devices 40 are formed in the device regions 100, 200, 300. The devices 40 can be any active devices, e.g., transistors, formed by conventional fabrication processes. For example, the devices 40 can be formed by gate first or gate last processes as known to those of skill in the art such that no further explanation is required for a complete understanding of the present disclosure. The devices 40 include gate dielectric material, e.g., high-k materials, and sidewall spacers formed on the sidewalls of gate electrode material, each of which can be implemented using conventional CMOS fabrication structures as described herein. Source and drain regions are formed within the substrate material using convention ion implantation processes or doped epitaxial material processes as is known by those of skill in the art.

In embodiments, the device 40 in the device region 300 will be provided between the deep trench isolation structures 28a', over the recrystallized semiconductor material 38; whereas, the devices 40 in the device regions 100, 200 (with the localized SOI regions with cavity structures) can be formed in alignment with either the cavity structures 30, 36 or the pillars 12c, depending on the desired device performance. Accordingly, and in this way, it is now possible to form different devices in both SOI technologies and bulk technologies, with a modulation of the substrate thickness, e.g., Tsi1, Tsi2, etc. in the SOI technology regions, e.g., device regions 100, 200.

Figure 9:
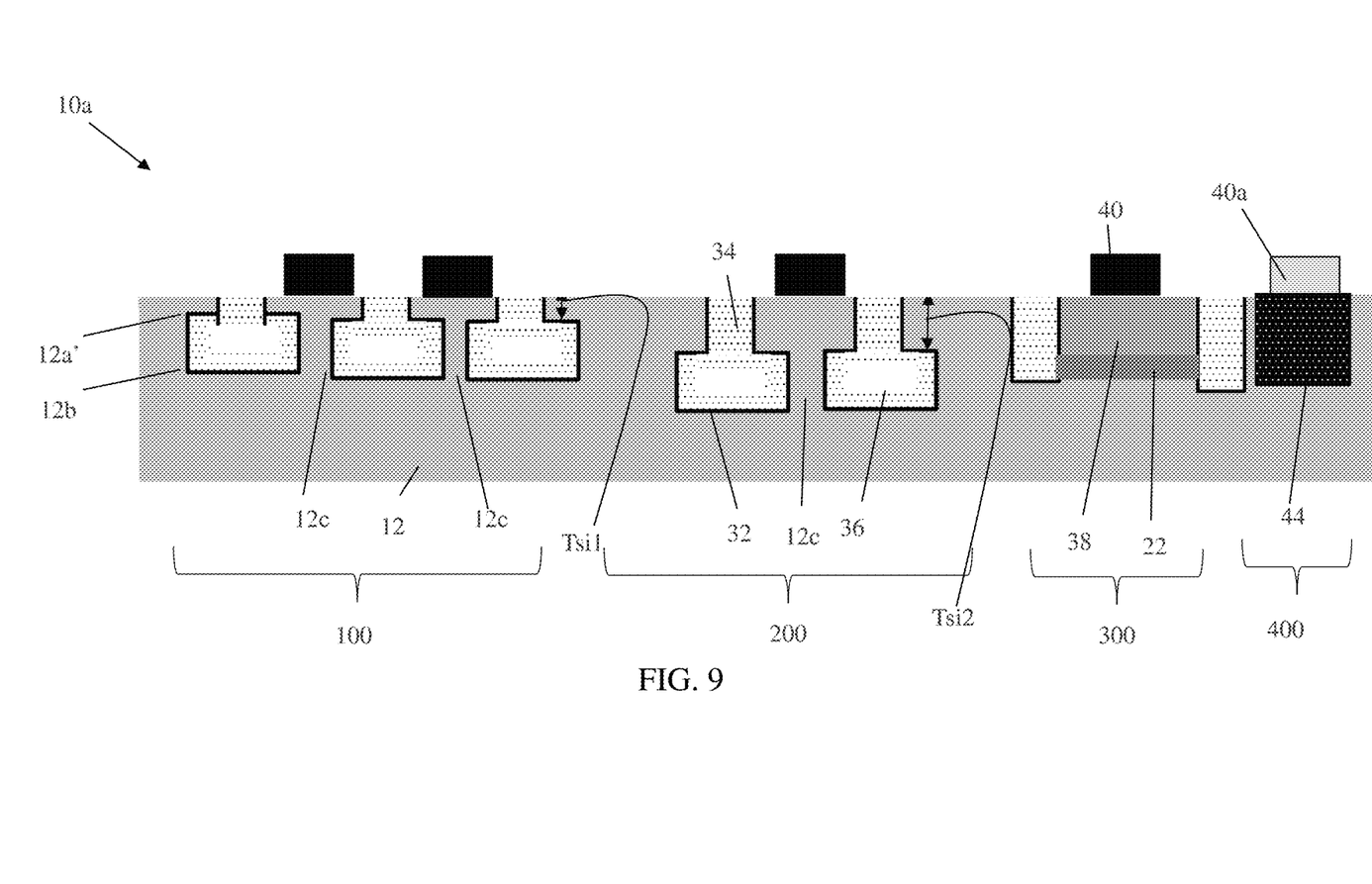
FIG. 9 shows a structure in accordance with additional aspects of the present disclosure.

FIG. 9 shows a structure in accordance with additional aspects of the present disclosure. In the structure 10a of FIG. 9, an additional device region 400 is shown. This device region 400 includes a poly region 44 with a passive device 40a.

The structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a bulk substrate with localized semiconductor on insulator (SOI) regions and bulk device regions, the localized SOI regions comprising multiple cavity structures and substrate material of the bulk substrate, wherein the multiple cavity structures are of different dimensions in different device regions of the localized SOI regions.

2. The structure of claim 1, wherein the multiple cavity structures are lined with insulator material and include an airgap.

3. The structure of claim 2, further comprising shallow trench isolation structures extending to the multiple cavity structures in the localized SOI regions.

4. A structure comprising a bulk substrate with localized semiconductor on insulator (SOI) regions and bulk device regions, the localized SOI regions comprising multiple cavity structures and substrate material of the bulk substrate, wherein the substrate material above the cavity structures has variable thicknesses in different device regions of the localized SOI regions.

5. The structure of claim 4, wherein the substrate material above the multiple cavity structures is crystalline Si material.

6. The structure of claim 1, wherein the bulk device regions include buried trap rich/damage layer and a device over the buried trap rich/damage layer and deep trench isolation structures surround the buried trap rich/damage layer.

7. A structure comprising a bulk substrate with localized semiconductor on insulator (SOI) regions and bulk device regions, the localized SOI regions comprising multiple cavity structures and substrate material of the bulk substrate, wherein the bulk device regions include a polycrystalline layer and a passive device on the polycrystalline layer.

8. The structure of claim 1, wherein the bulk device regions and the localized SOI regions are coplanar.

9. The structure of claim 1, further comprising partially oxidized semiconductor pillars between the multiple cavity structures.

10. A structure comprising:
 at least one bulk device region comprising bulk substrate material; and
 a plurality of localized semiconductor on insulator (SOI) device regions coplanar with the at least one bulk device region, the localized SOI device regions comprising multiple cavity structures having different depths within the bulk substrate material and an upper layer of the bulk substrate material.

11. The structure of claim 10, wherein the upper layer of the bulk substrate material is crystalline Si material.

12. The structure of claim 10, wherein the upper layer of the bulk substrate material located in different device regions has different thicknesses above the multiple cavity structures.

13. The structure of claim 10, further comprising shallow trench isolation structures extending to the multiple cavity structures and the multiple cavity structures are lined with same insulator material used in the shallow trench isolation structures.

14. The structure of claim 10, wherein the multiple cavity structures located in different device regions are of different dimensions.

15. The structure of claim 10, wherein the at least one bulk device region includes a buried trap rich/damage layer and a device over the buried trap rich/damage layer.

16. The structure of claim 10, wherein the at least one bulk device region includes a polycrystalline layer and a passive device on the polycrystalline layer.

17. The structure of claim 10, further comprising one of fully and partially oxidized semiconductor pillars between the multiple cavity structures.

18. The structure of claim 10, further comprising a plurality of devices in the plurality of localized semiconductor on insulator (SOI) device regions, above the multiple cavity structures, and at least one device in the at least one bulk device region.

19. A method comprising:
 forming amorphous regions of a first depth within a bulk substrate;
 forming amorphous regions of a second depth within the bulk substrate;
 removing the amorphous regions to form cavity structures at the first depth and the second depth, leaving substrate material of the bulk substrate above the cavity structures; and
 lining the cavity structures with insulator material,
 wherein the cavity structures are of different dimensions in different device regions of localized SOT regions.

* * * * *

UNITED STATES PATENT AND TRADEMARK OFFICE
CERTIFICATE OF CORRECTION

PATENT NO. : 11,488,980 B2
APPLICATION NO. : 17/003179
DATED : November 1, 2022
INVENTOR(S) : Siva P. Adusumilli et al.

It is certified that error appears in the above-identified patent and that said Letters Patent is hereby corrected as shown below:

In the Claims

Claim 19, Line 44 at Column 8, change "SOT" to ""SOI"".

Signed and Sealed this
Twenty-eighth Day of February, 2023

Katherine Kelly Vidal
*Director of the United States Patent and Trademark Office*